United States Patent [19]
Hildering

[11] 4,184,043
[45] Jan. 15, 1980

[54] METHOD OF PROVIDING SPACERS ON AN INSULATING SUBSTRATE

[75] Inventor: Willem C. Hildering, Eindhoven, Netherlands

[73] Assignee: U.S. Philips Corporation, New York, N.Y.

[21] Appl. No.: 898,653

[22] Filed: Apr. 21, 1978

[30] Foreign Application Priority Data

May 2, 1977 [NL] Netherlands .......................... 7704770

[51] Int. Cl.² .......................... B05D 5/12; B01J 17/00; H01L 7/02; H01R 43/00
[52] U.S. Cl. .................................... 174/68.5; 427/96; 427/282; 339/17 R; 29/589; 29/628
[58] Field of Search .............. 427/96, 282; 339/17 R; 174/68.5; 29/589, 628

[56] References Cited
U.S. PATENT DOCUMENTS 3,832,769  9/1974  Olyphant ................................ 29/589

FOREIGN PATENT DOCUMENTS 1440196  6/1979  United Kingdom .

OTHER PUBLICATIONS

Miller, IBM Tech. Dis. Bul., vol. 8, No. 3, Aug. 1965.
Fisher, Paragraph 13 of Handbook of Thick Film Technology, by Holmes and Loasby, Electrochem. Publications Limited, 29 Banns St., Ayr, Scotland, 1976.

*Primary Examiner*—Michael F. Esposito
*Assistant Examiner*—Richard Bueker
*Attorney, Agent, or Firm*—Thomas A. Briody; Edward J. Connors, Jr.; Paul R. Miller

[57] ABSTRACT

In a method of providing spacers on an insulating substrate, by which spacers the thickness of a connection between an electrical component and a substrate is adjusted, the spacers are rigidly provided on the substrate as a thick film pattern simultaneously with and with the same material as is used for at least one further thick film coating required for an electrical circuit on the substrate.

7 Claims, 2 Drawing Figures

METHOD OF PROVIDING SPACERS ON AN INSULATING SUBSTRATE

The invention relates to a method of providing spacers on an insulating substrate by which spacers the thickness of a connection between an electrical component and a substrate is adjusted. The invention also relates to a substrate provided with spacers manufactured by means of the method and to such a substrate provided with an electrical component bearing on the spacers.

When providing electrical components on an insulating substrate, a number of problems may arise. One of these problems is the possibility of shortcircuit between connections of the electrical components or conductors on the substrate, as a result of the lateral pushing away of solder or conductive adhesive during connecting the component. This problem can be avoided by using very thin soldered or adhesive joints. It has been found, however, that in that case another problem may occur, namely that of thermal fatigue. When the temperature changes, the expansion of the substrate and the electrical component will generally not be the same; a very thin layer of solder or adhesive has too low a resistance against the occurring stresses and the connection may work loose after some time.

It is known from German Offenlegungsschrift No. 2,228,703 to place separate spacers between the electrical component and a substrate, said spacers having a thickness which corresponds to the desired thickness of the layer of solder. It will be obvious that the use of separate spacers make the connection of the electrical component to the substrate complicated and the automated performance of the connection is substantially impossible.

It is furthermore known from I.B.M. Technical Disclosure Bulletin, Volume 8, No. 3, Ausgust 1965, p. 380 to connect semiconductor elements to conductors on an insulating substrate by "flip-chip" technique. The required distance between the semiconductor element and the substrate is obtained in that so-called standoffs are vapour-deposited on the semiconductor element. The vapour deposition of said standoffs means a serious complication in the manufacture, it is expensive, and it cannot be performed for many electrical components.

It is the object of the invention to provide a method of providing spacers on an insulating substrate, which method can be carried out simply and which permits of making a suitable connection to an electrical component which can withstand thermal fatigue and shortcircuit. In order to reach the end in view, according to the invention, the spacers are rigidly formed on the substrate as a thick film pattern, which provision of the spacers is carried out simultaneously with and with the same material as at least one further thick film coating which is necessary for an electrical circuit on the substrate.

The rigid provision of spacers on the substrate in one operation simultaneously with further thick film elements has great advantages as compared with the known method. The spacers can be provided on the substrate in a simple manner, both their location and their height being accurately controlled. A separate operational step is not necessary. The spacers are provided simultaneously with, for example, the screen printing of another necessary thick film pattern. The choice of the material for the spacers may be arbitrary. If they are to be insulating, glass or a synthetic resin will usually be chosen; if the insulating effect of the spacers is of no significance, material may be chosen which is used for silk-screening resistors or conductors on the substrate. The spacers obtained on the substrate by means of the method according to the invention constitute an elegant solution to obtain a connection of a desired thickness between an electrical component and the substrate, which connection has a large resistance against thermal fatigue and will not cause shortcircuit.

An application of a substrate having spacers will be shown by way of example in the drawing.

Figure 1:
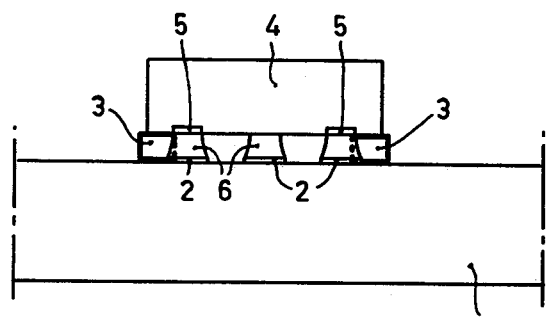
FIG. 1 is a front elevation of a part of a substrate provided with spacers on which substrate an electrical component is mounted.
Figure 2:
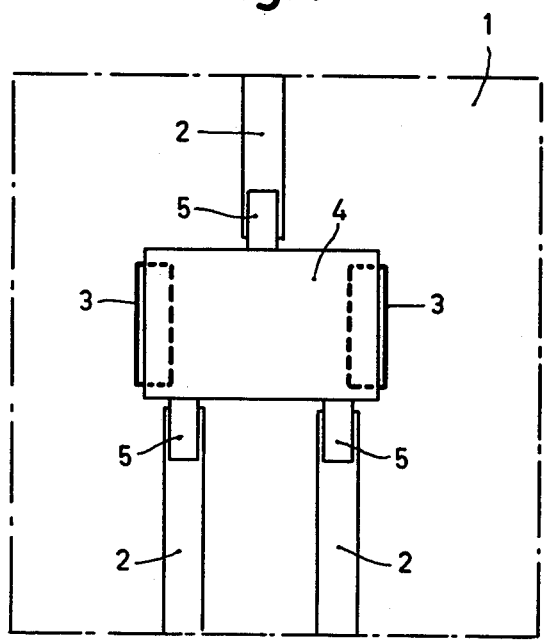
FIG. 2 is a plan view of FIG. 1.

The figures shown an insulating substrate 1, for example of aluminium oxide. Conductors 2, for example of palladium-silver, are present on the substrate 1. Spacers 3 are formed on the substrate by means of a thick film process which involves screen-printing the spacer pattern onto the substrate in the form of a paste and then firing the paste to form the spacers; said spacers are provided simultaneously with a further thick-film coating which is not shown in the drawing and which is desired for an electrical circuit on the substrate. The material chosen in this example is an insulating material, for example glass. If the spacers are of a material, not producing an undesired electrical shortcircuit, they may also be screen-printed on the substrate simultaneously with further required conductors or resistors and they may consist of the same material.

An electrical element 4 which has connections 5 in its bottom surface bears on the spacers 3. The drawing shows a semiconductor device 4; it will be obvious that any desired electrical element, for example a resistor, a capacitor, and so on, may be used.

Solder or conductive adhesive 6 is present on the conductors 2 near the connection points to the connection 5. The spacers are given such a height that the layer 6 of solder or adhesive has a suitable thickness to prevent thermal fatigue in the layer 6. Due to temperature variations, stresses may arise in the layer 6 as a result of the differences in expansion between the substrate and the electrical component. In the case of a sufficient thickness of the layer 6 it is prevented that said stresses cause a working loose of the connection. In the embodiment shown the spacers 3 have a height of approximately 40 microns. Such a quantity of solder has been provided on the conductors 2, preferably by means of screen-printing, that the connections 6 obtain the shape shown, in which no shortcircuit can occur and thermal fatigue is avoided.

Two spacers 3 are shown in the drawing. It will be obvious that more than two spacers may alternatively be used which need then not be elongate but may, for example, have a cylindrical shape. It is alternatively possible to use only one spacer of, for example, annular or U-shaped construction. It will furthermore be obvious that arbitrary electrical components may be used which may have more or fewer than three connections.

The temperature variations may occur, for example, by thermal dissipation of the component 4 itself, or by dissipation of an adjacent electrical component.

What is claimed is:

1. A method of providing spacers on an insulating substrate, said spacers adjusting the thickness of electrical connections between electrical components and said substrate, said method comprising rigidly forming said spacers on said substrate as a thick film pattern by simultaneously providing said spacers on said substrate together with at least one further thick film coating which is required for providing electrical circuits on said substrate, said spacer being of the same material as said at least one further thick film coating.

2. A method as claimed in claim 1, wherein said spacers are provided on said substrate by a screen printing process.

3. a substrate having spacers formed thereon by the method as claimed in claims 1 or 2.

4. A substrate as claimed in claim 3, wherein an electrical component bears on said spacers, and is connected to said substrate by means of solder or conductive adhesives.

5. A method as claimed in claim 1, wherein said spacers are formed of an insulating material.

6. A method as claimed in claim 2, wherein said spacers are formed of a conducting material.

7. A method as claimed in claim 1, wherein said spacers are formed to a thickness of approximately 40 microns.

* * * * *